(12) United States Patent
Kim et al.

(10) Patent No.: US 8,264,074 B2
(45) Date of Patent: Sep. 11, 2012

(54) DEVICE FOR USE AS DUAL-SIDED SENSOR PACKAGE

(75) Inventors: Woojin Kim, Irvine, CA (US); Aniela Bryzek, Hayward, CA (US); John Dancaster, Fremont, CA (US); Dong-Suk Kim, Hwasung-shi (KR)

(73) Assignee: General Electric Company, Schenectady, NY (US)

( * ) Notice: Subject to any disclaimer, the term of this patent is extended or adjusted under 35 U.S.C. 154(b) by 104 days.

(21) Appl. No.: 12/879,143

(22) Filed: Sep. 10, 2010

(65) Prior Publication Data

US 2012/0061775 A1 Mar. 15, 2012

(51) Int. Cl.
*H01L 23/535* (2006.01)

(52) U.S. Cl. ........ 257/686; 257/680; 257/685; 257/784; 257/E23.128; 257/E23.169; 438/109

(58) Field of Classification Search .................. 257/680, 257/685, 686, 723, 724, 784, E23.128, E23.169; 438/109
See application file for complete search history.

(56) References Cited

U.S. PATENT DOCUMENTS

| | | | |
|---|---|---|---|
| 5,366,933 A | 11/1994 | Golwalkar et al. | |
| 5,545,922 A | 8/1996 | Golwalkar et al. | |
| 6,051,878 A * | 4/2000 | Akram et al. | 257/686 |
| 6,153,928 A * | 11/2000 | Cho | 257/686 |
| 6,172,424 B1 * | 1/2001 | Kinouchi et al. | 257/787 |
| 6,316,838 B1 * | 11/2001 | Ozawa et al. | 257/778 |
| 6,590,279 B1 * | 7/2003 | Huang et al. | 257/676 |
| 6,680,531 B2 * | 1/2004 | Hsu et al. | 257/723 |
| 6,707,141 B2 * | 3/2004 | Akram | 257/686 |
| 6,927,485 B2 * | 8/2005 | Lai et al. | 257/686 |
| 7,309,923 B2 * | 12/2007 | Kee | 257/777 |
| 7,408,254 B1 * | 8/2008 | Kim et al. | 257/686 |
| 7,736,946 B2 * | 6/2010 | Seppala et al. | 438/106 |
| 7,847,387 B2 * | 12/2010 | Kilger et al. | 257/686 |
| 7,939,920 B2 * | 5/2011 | Wallace | 257/676 |
| 2001/0015488 A1 * | 8/2001 | Akram et al. | 257/686 |
| 2007/0096284 A1 * | 5/2007 | Wallace | 257/686 |
| 2008/0213933 A1 * | 9/2008 | Fisher et al. | 438/48 |
| 2011/0260266 A1 * | 10/2011 | Han et al. | 257/415 |

* cited by examiner

*Primary Examiner* — Allan R Wilson
(74) *Attorney, Agent, or Firm* — Global Patent Operation; Mark A. Conklin

(57) ABSTRACT

A sensor package, and in one embodiment a sensor package for surface mount applications, that comprises a leadframe with an upper and lower surface for receiving a device thereon. Embodiments of the sensor package comprise a first device secured to the upper surface, and a second device secured to the lower surface so as to place connective pads from each of the first device and the second device proximate to one side of the leadframe. The sensor package further comprises a lead that is positioned in the sensor package in a manner that prevents electrical connection with circuitry that is external of the housing. The lead has an end proximate the side of the lead frame where the connective pads are positioned on the upper and lower surfaces. The end configured to receive connections, e.g., wirebonds, from the connective pads in a manner connecting the first device and the second device independent of any external connections of the sensor package.

20 Claims, 7 Drawing Sheets

A-A

Detail C

DEVICE FOR USE AS DUAL-SIDED SENSOR PACKAGE

BACKGROUND OF THE INVENTION

The subject matter disclosed herein relates generally to sensor packages, and more particularly to sensor packages that employ devices electrically coupled together with connections independent of other connections in the sensor package.

Sensor packages that employ semiconductor devices are used in various applications because of their small and compact size. One example of such a sensor package is employed by tire pressure monitoring ("TPM") systems, which employ sensors and sensor packages to monitor, among other things, the pressure in automotive tires. These systems provide a safety warning to alert the driver of low tire pressure. In addition, TPM systems can also provide to the driver other information (e.g., temperature, acceleration, and velocity), which may encourage proper maintenance of even tire pressure. This can result in many benefits, including better fuel economy and extended tire life.

Systems like the TPM systems discussed above typically employ a variety of components that sense, process, and transmit data to other systems, and generally to the driver. One component is a pressure sensor for sensing tire pressure, and providing data outputs indicative thereof. Another component is a processor such as an application specific integrated circuit ("ASIC") that is responsive to these data outputs, as well as other data from other components. These components can be packaged together in the form of the sensor package, many of which are configured so they can be surface-mounted to other substrates, e.g., printed circuit boards.

It is often required that selection of the components is provided in a manner that maintains flexibility in the general function, operation, and configuration of the sensor package. It is likewise desirable that, while new configurations of the sensor package will come at reduce costs of materials, and manufacturing resources, there is no reduction in the level, and array of available functionality is realized in the new sensor package.

Certain types of sensor packages have incorporated these particular qualities into a relatively small, compact device. There are, for example, sensor packages that have a sensor device, and a processing device that are mounted to opposite sides of a substrate. While these two devices communicate via leads inside of sensor package, the devices are mounted on opposite sides of the substrate. Not only does this configuration act as a limiting factor in the size of the package, but it also requires longer interconnection distances between the devices, which can affect the performance, the functionality, and the flexibility of the sensor package.

Therefore, it would be advantageous to have a sensor package that can collect data and information, but that can also provide a platform for further changes and expansion of these functions. It would also likewise be advantageous for such sensor package to be configured to reduce mechanical stresses on particular areas of the package, and to provide access to the environment for data collection, but that also protects other areas of the package from the environment. Moreover, such sensor packages could still further be configured to employ minimal interconnection lengths between components, such as the interconnection lengths between the sensor devices and the processing devices.

BRIEF DESCRIPTION OF THE INVENTION

In one embodiment, a sensor package can comprise a substrate that can comprise a first side, an upper surface, and a lower surface in opposing relation to the upper surface. The sensor package can also comprise a first device disposed on the upper surface, the first device comprising a first connective pad proximate the first side of the substrate. The sensor package can further comprise a second device disposed on the lower surface, the second device comprising a second connective pad proximate the first side of the substrate. The sensor package can yet further comprise a housing in surrounding relation to the second device, the housing comprising a cavity exposing the first device to an environment external to the housing, and a first lead coupled to the first connective pad and the second connective pad, the first lead comprising an end proximate the first side. Moreover, the embodiment of the sensor package can be further described where the first lead can receive a wirebond from each of the first connective pad and the second connective pad in a manner that forms a connection between the first device and the second device entirely inside of the housing.

In another embodiment, a sensor package for mounting to the surface of a printed circuit board. This embodiment of the sensor package can comprise a leadframe comprising an outer edge in surrounding relation to a placement area having a first side, a second side, and a pair of opposing surfaces, the opposing surfaces comprising an upper surface and a lower surface in planar relation to the upper surface. The sensor package can also comprise a sensor disposed on the upper surface, the sensor comprising a plurality of sensor devices, each of the sensor devices comprising a connective pad proximate the first side of the placement area. The sensor package can further comprise a processing device disposed on the lower surface, the processing device comprising a connective pad proximate the first side of the placement area, the processing device for processing data from the sensor devices. The sensor package can yet further comprise a housing surrounding the leadframe, the housing comprising a portion sealing the processing device from an environment external to the housing, and a cavity exposing at least one of the sensor devices to the environment, and a plurality of leads, one lead coupled to each of the connective pads of the sensor devices, each of the leads comprising an end proximate the first side. The sensor package can further be described where the leads receive a wirebond from the connective pads so as to form a connection between the sensor devices and the processing device that is entirely within the housing.

In still another embodiment, there is provided a method for manufacturing a sensor package. The method can comprise in one step forming a leadframe comprising an outer edge in surrounding relation to a placement area having a first side, an upper surface and a lower surface in planar relation to the upper surface. The method can also comprise in another step mounting a first sensor device to the upper surface in a manner positioning a first connective pad proximate the first side of the placement area. The method can also comprise in yet another step mounting a processing device to the lower surface in a manner positioning a second connective pad proximate the first side of the placement area. The method can further comprise in still other steps forming a housing by over molding the processing device in a manner isolating the processing device from an environment outside of the housing, and wirebonding the first connective pad and the second connective pad to a first lead, the first lead comprising an end proximate the first side. The method can yet further be described where the first lead receives a wirebond from each of the first connective pad and the second connective pad so as to form a connection between the first sensor device and the processing device that is entirely within the housing.

BRIEF DESCRIPTION OF THE DRAWINGS

So that the manner in which the features of the invention can be understood in detail, a detailed description of which can be had had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the principles of certain embodiments of the invention.

Thus, for further understanding of the invention, references can be made to the following detailed description, read in connection with the drawings in which.

DETAILED DESCRIPTION OF THE INVENTION

This written description uses examples to disclose the invention, including the best mode, and also to enable any person skilled in the art to practice the invention, including making and using any devices or systems and performing any incorporated methods. The patentable scope of the invention is defied by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

With reference to the drawings generally, and FIGS. 1-7 in particular, there is provided embodiments of a sensor package that comprise devices positioned on opposite sides of a substrate. Each device comprises a connective pad that is positioned in a region of the substrate proximate a portion of the sensor package, or "area of interconnectivity," which is effectively free of connections to circuitry that is outside of the sensor package. Utilizing the area of interconnectivity reduces the number of electrical interconnects that are required for the operation of the sensor package. That is, the number of electrical interconnects that are used in sensor packages of the type that are disclosed and contemplated herein is significantly less than other sensor packages with comparable functionality. This reduction in the number of interconnects, while in and of itself significant, also reduces the size, or footprint, of such sensor packages so that the footprint is significantly less than other sensor packages without substantially compromising functionality.

Figure 1:
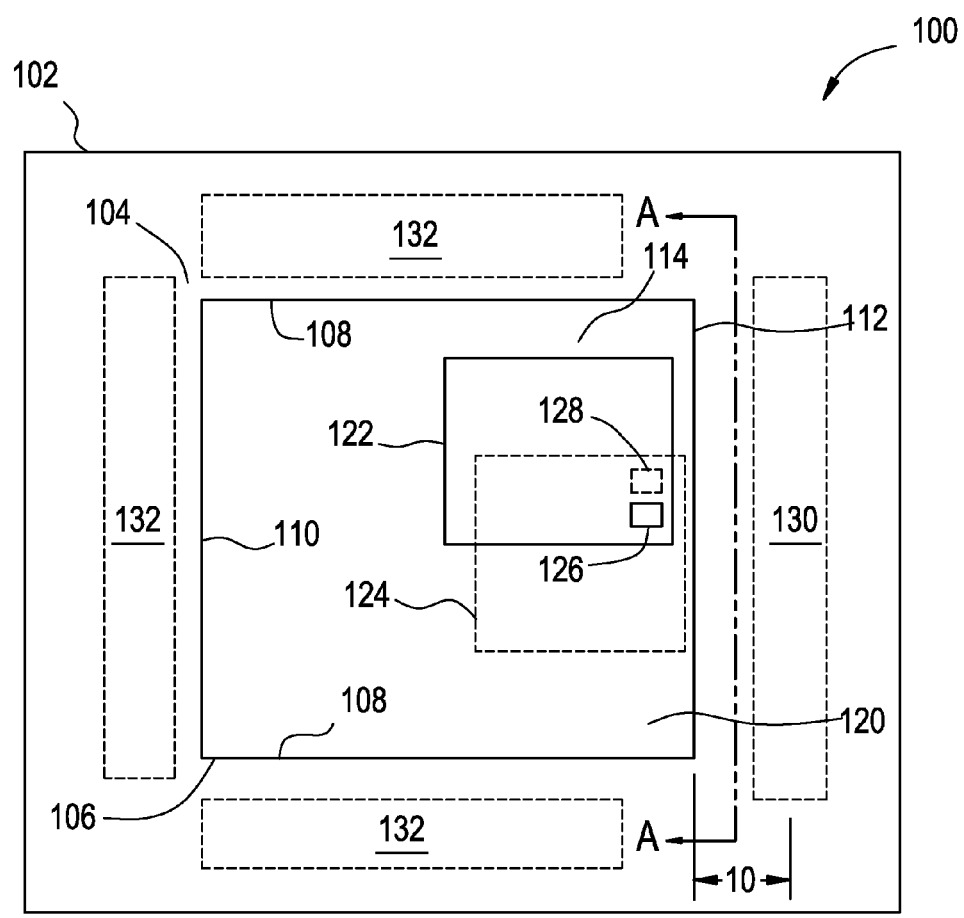
FIG. 1 is a top, plan view of schematic diagram of one embodiment of a sensor package that is made in one embodiment of the invention.
Figure 2:
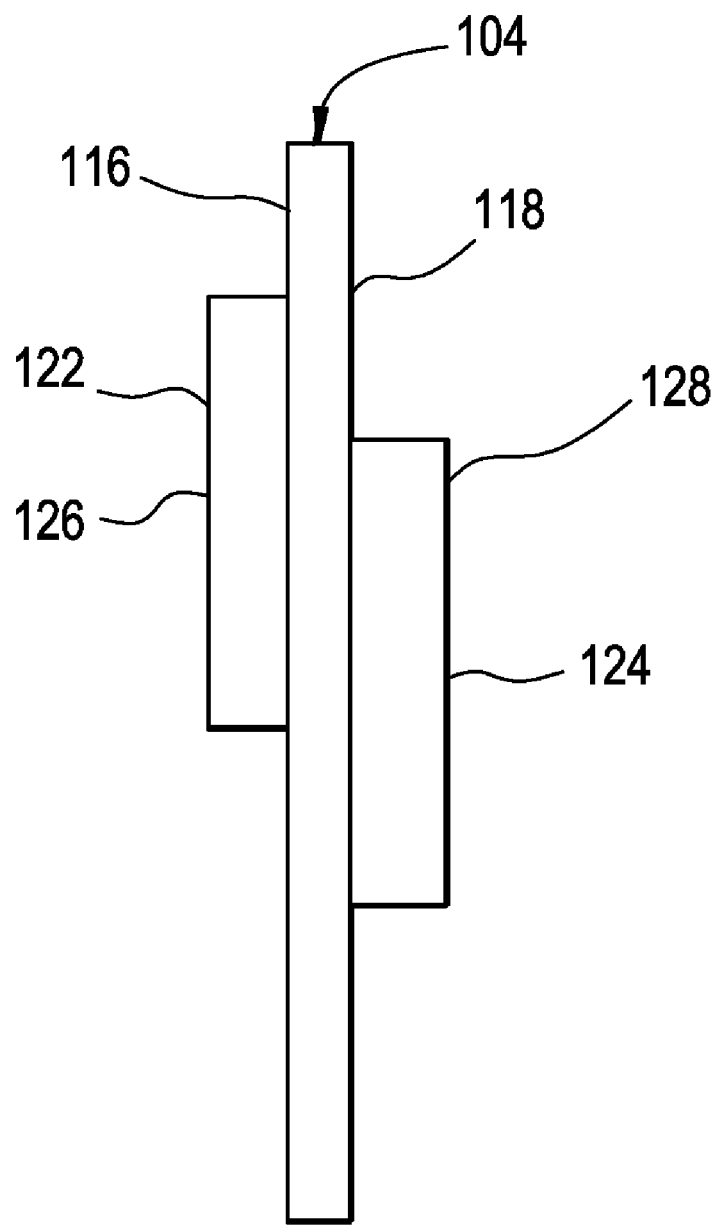
FIG. 2 is a side, plan view of the sensor package of FIG. 1.

A high-level, schematic diagram of an embodiment of a sensor package 100 that is made in one embodiment of the invention is illustrated in FIGS. 1 and 2. It is seen that the sensor package 100 can comprise a housing 102 in surrounding relation to a substrate 104 with an outer edge 106 that has lateral sides 108, a rear side 110, and a front side 112. The outer edge 106 can define a placement area 114 with an upper surface 116, and a lower surface 118 that is opposite the upper surface 116. Each of the upper surface 116 and the lower surface 118 of the placement area 114 can comprise an internal connection region 120, which is located proximate one of the sides (e.g., the lateral sides 108, the rear side 110, and the front side 112) of the substrate 104.

The sensor package 100 can also comprise a first device 122 and a second device 124, which is disposed on the surface of the substrate 104 opposite the first device 122. Each of the first device 122 and the second device 124 comprises, respectively, a first connective pad 126 and a second connective pad 128. The sensor package 100 can further comprise an area of interconnectivity 130, and areas of external connectivity 132 that are different from the area of interconnectivity 130. Here, it is seen in the example of FIG. 1 that the area of interconnectivity 130 is proximate the front side 112 of the substrate 104. It may be desirable, however, that in some embodiments of the sensor package 100, the area of interconnectivity 130 is proximate other sides (e.g., the lateral sides 108, and the rear side 110) so as to also be proximate the internal connection region 120.

It is noted that the terms "front side," "rear side," and "lateral side" are used to refer to sides of an element or object, e.g., sensor package 100, substrate 104, and/or outer edge 106, and do not limit the scope and extent of the present disclosure. Rather, and as discussed in connection with the embodiments of the sensor packages that are contemplated by the present disclosure, parts of the sensor package are configured, or positioned, relative to the outer edge 106, and more particularly to one or more of the front side, rear side, and lateral side. For example, while generally being defined as the relative location of some or all of these parts, it will in some embodiments include one part of the sensor package, e.g., the internal connection region 120, which is positioned relative to another part of the sensor package, e.g., the front side 112 of the substrate 104.

More particularly, it is seen in the embodiment of the sensor package 100 of FIGS. 1 and 2 that the first device 122 and the second device 124 are positioned on, respectively, the upper surface 116 and the lower surface 118 so that each of the first connective pad 126 and the second connective pad 128 are proximate the front side 112 of the substrate 104, and generally inside of the internal connection region 120. Such configuration permits each of the first connective pad 126 and the second connective pad 128 to be connected, e.g., by wire-bonding, to the area of interconnectivity 130. This, in turn, allows electrical signals to pass between the first connective pad 126 and the second connective pad 128.

The area of interconnectivity 130, more detailed examples of which being had in FIGS. 3-7 and discussed below, is generally constructed in a manner that facilitates conduction of the electrical signals. It is generally free of external connections such as those connections that can receive, transmit, or facilitate communication between portions inside of the sensor package 100, and portions outside of the sensor package 100. While generally being made of conductive materials (e.g., metals, conductive plastics, etc.), it is likewise recognized that the construction of the area of interconnectivity 130 is such that it can receive, support, and otherwise conductively interact with the connective elements (and associated materials that are used to manufacture components of the sensor package), such as the wirebonds that extend from the first and second connective pads discussed above.

In one embodiment of the sensor package 100, the area of interconnectivity 130 can be located in a position relative to the internal connection region 120 so as to minimize the interconnection length between the first device 122 and the second device 124. As it is illustrated in FIG. 1, this position is proximate the front side 112, but it is also contemplated that the area of interconnectivity 130 can be located in other positions based, in part, on the location of the internal connection region 120. In one example, the position is defined by an interconnectivity dimension ID, which measures the distance from the outer edge 106 of the substrate 104 to the location in the area of interconnectivity 130 of connection with the devices (e.g., first device 122, and second device 124).

Devices for use as the first device 122 and the second device 124 can be selected based on one or more desired functions for the sensor package 100. It may be desirable, for example, that the sensor package 100 is configured to measure one or more environment properties such as pressure, acceleration, temperature, current, and voltage. Each of these properties may require a separate device, or combination of devices, that can detect the environmental properties. These devices may comprise integrated circuits with discrete elements such as transistors, capacitors, and resistors, the combination of which is selected to provide the necessary functionality to detect the environmental properties. A more detailed discussion of certain types of these devices is provided in connection with FIGS. 3-4 below.

Figure 3:
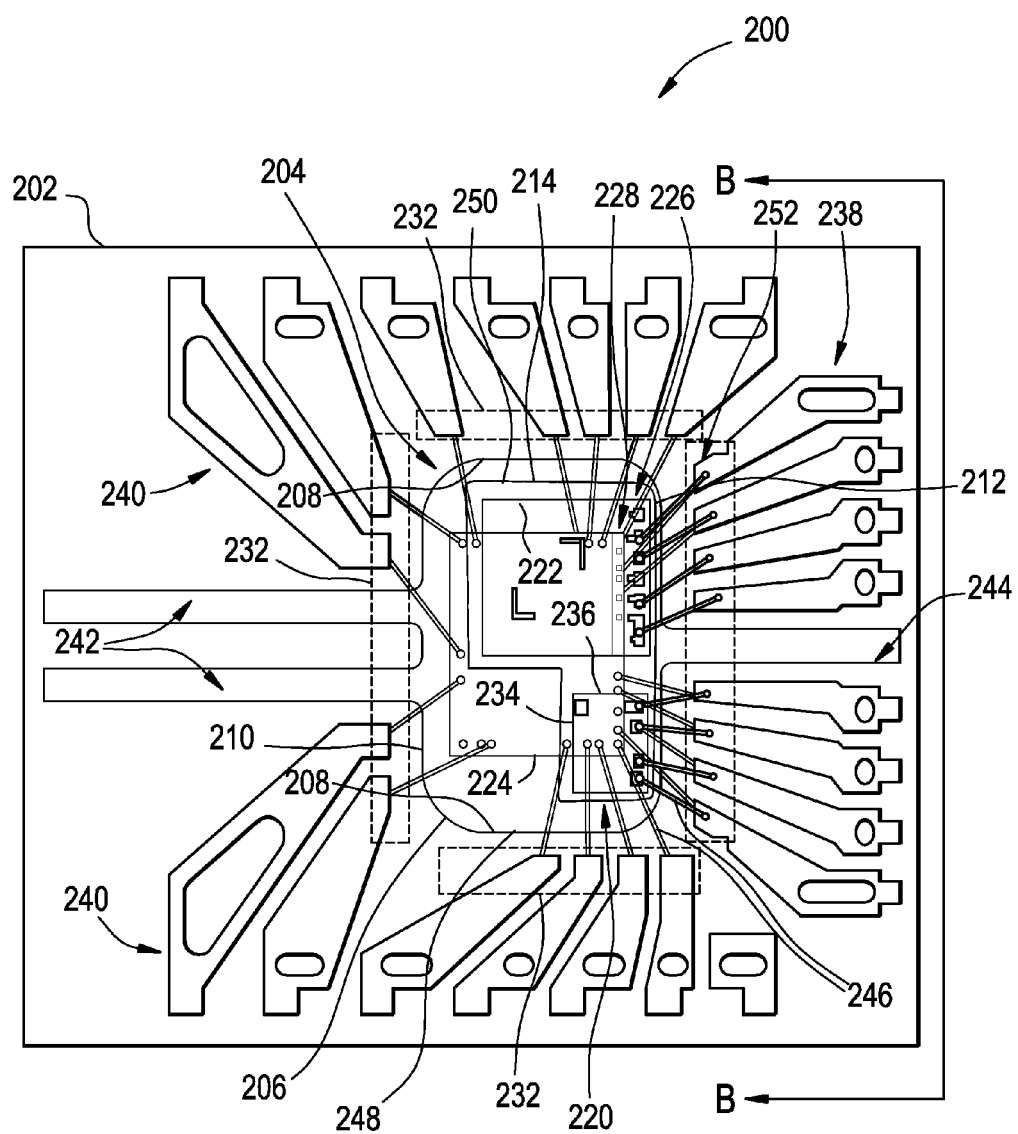
FIG. 3 is a top, plan view of another embodiment of a sensor package that is made in one embodiment of the invention.
Figure 4:
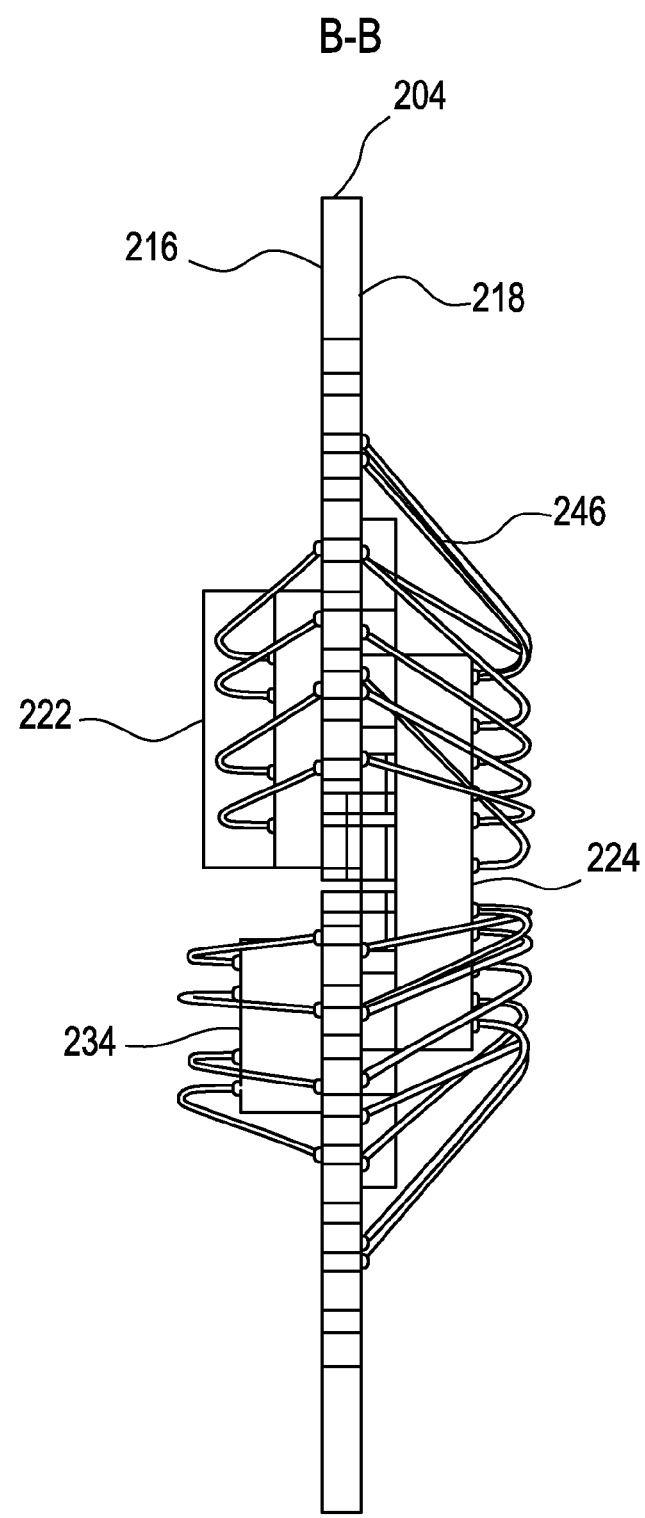
FIG. 4 is a side, plan view of the sensor package of FIG. 3.

For example, and with reference to FIGS. 3 and 4, a top view (FIG. 3), and a side view (FIG. 4) of another embodiment of a sensor package 200 is illustrated. Here, like numerals are used to identify like components that were discussed in connection with the sensor package 100 of FIGS. 1 and 2, but the numerals are increased by 100. For purposes of example only, the sensor package 200 may comprise a housing 202, a substrate 204 that has a placement area 214 with an upper surface 216 and a lower surface 218. The sensor package 200 can also comprise a first device 222 with a first connective pad 226, a second device 224 with a second connective pad 228, an area of connectivity 230, and an area of external connectivity 232. The sensor package 200 can further comprise a third device 234 that has a third connective pad 236, a plurality of leads 238, a plurality of leadouts 240, rear tie bars 242, and a front tie bar 244. The sensor package 200 can further comprise wirebonds 246, which electrically couple the connective pads 226, 228, 236 to the leads 238 and the leadouts 240.

In one embodiment of the sensor package 200, the substrate 204 comprises a leadframe 248 constructed in a manner that places the upper surface 216 and the lower surface 218 in a substantially planar (and/or parallel) configuration. The leadframes 248 is typically formed from a metal ribbon, so that a plurality of leadframes 248 is manufactured together, where each of the leadframes 248 is joined end-to-end along the rear tie bars 242, and the front tie bar 244. This facilitates singulation of the respective leadframes 248, permitting construction of the sensor package 200 as discussed in more detail below.

Further to the discussion of the devices that can be used in the sensor packages above, the first device 222 and the third device 234 form, in one respect, a sensor 250 that is responsive to environmental properties in an environment about the housing 202. By way of non-limiting example, the first device 222 is responsive to pressure changes in the environment, and the third device 234 is responsive to acceleration. Moreover, in one particular implementation of the sensor package 200, the first device 222 is a micro-electrical-mechanical systems ("MEMS") device, an example of which is a Backside Absolute Pressure ("BAPS") sensor die provided by General Electric of Fremont, Calif. The second device 224 can be an integrated circuit ("IC") chip such as an application specific integrated circuit ("ASIC") chip. It is typically configured to communicate with the first device 222, and the third device 234 to capture information and data, and more particularly to capture data related to the environmental properties.

The first device 222, the second device 224, and the third device 234 ("the devices") are secured to the placement area 214 using conventional processes and materials. This includes, for example, adhesives, gels, and other fluids and/or flowing materials that are compatible with the devices and the substrate 204. In some implementations of the sensor package 200, the materials that are selected can be of the type that can withstand caustic environments, as well as environments that are otherwise detrimental to materials that are not specifically selected for such environment.

The leads 238 are positioned inside of the housing 202 so as to prevent electrical connection of the leads 238 with circuitry external to the housing 202. While the entire body of the leads 238 may reside exclusively within the housing 202, certain construction of the sensor package 200 may cause some parts and portions of the leads 238 to penetrate the housing 202. In one embodiment, each of leads 238 includes an end 252 proximate the front side 212. This may position the ends 252 in the area of interconnectivity 230. The ends 252 are suited to receive the wirebonds 246, placement of which may require materials of adhesion that are compatible with the ends 252 (and the leads 238 generally). Such materials are selected so that the wirebonds 246 are secured to, and electrically coupled with the ends 252. As noted above, the connective pads (e.g., the first connective pad 226, the second connective pad 228, and the third connective pad 236), the wirebonds 246, and the ends 252 electrically couple the devices together, and more particularly couple the second device 224 to the first device 222, and the third device 234.

The leadouts 240 are also constructed of materials that can conduct electrical signals, and can receive wirebonds, e.g., wirebonds 246. In one example, and more clearly illustrated in FIGS. 5-7 below, each of the leadouts 240 can be formed integrally (and monolithically) with, or electrically coupled to, exterior legs, conductors, and pins that extend out of the housing 202. This permits the leadouts 240 to conduct electrical signals between the second device 224 and circuitry external to the housing 202.

Figure 5:
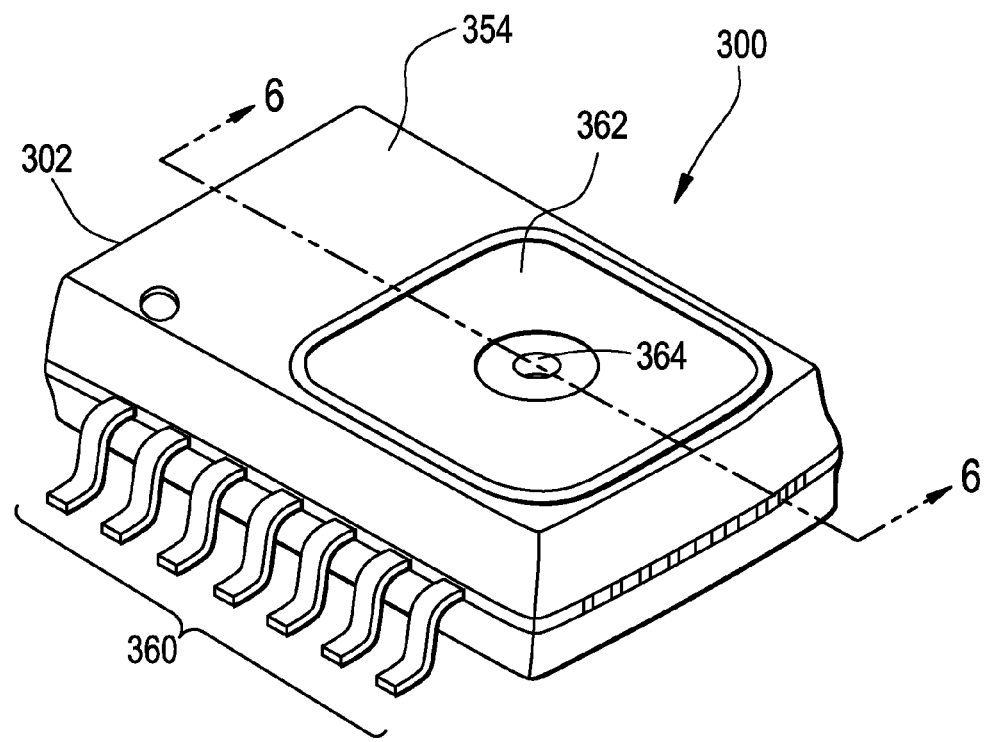
FIG. 5 is a perspective view of yet another embodiment of a sensor package that is made in one embodiment of the invention.
Figure 6:
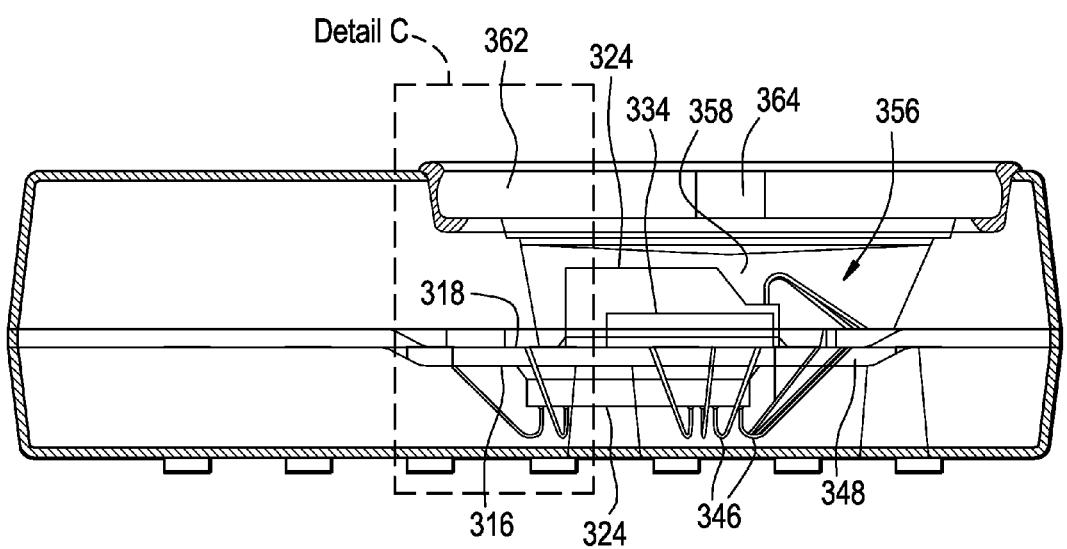
FIG. 6 is a cross-sectional, side, plan view of the sensor package of FIG. 5.

Referring next to FIGS. 5 and 6, a top view (FIG. 5), and a cross-sectional view (FIG. 6) of yet another embodiment of a sensor package 300 is illustrated. Again, as discussed in connection with FIGS. 3 and 4 above, like numerals are used in FIGS. 5 and 6 to identify like components, but the numbers are increased by 100. It is seen, for example, that the sensor package 300 can comprise a housing 302 in surrounding relation to a first device 322, a second device 324, and a third device 334. The housing 302 can also comprise an over-molded portion 354, and a cavity 356 with an encapsulating gel 358 disposed therein. The sensor package 300 can further comprise pins 360, and a cover 362 with an aperture 364 exposing the interior of the cavity 356 to the environment surrounding the housing 302.

The over-molded portion 354 may be formed by over-molding the various components of the sensor package 300. This includes, for example, over-molding the second device 324 and the leadframe 348 so as to protect these portions of the sensor package 300. Likewise, the cavity 356 is configured as the portion of the housing 302 that is not over-molded, but rather open so as to expose the first device 322, and the third device 334 to the environment. In one embodiment of the sensor package 300, illustrated and discussed in connection with the detail view of FIG. 7, the cavity 356 is formed with a wall 366, and a shelf 368 that extends into the cavity 356. While the dimensions of the shelf 368 can vary, in one example the shelf 368 is constructed so as to extend into the cavity 356 by an amount that prevents the encapsulating gel 358 from flowing over, and out of the cavity 356.

More particularly, the encapsulating gel 358 is deposited into the cavity 356 so as to cover the first device 322, and the third device 334. It may provide a level of protection to these devices 322, 334, without inhibiting the functionality of the devices 322, 334, and the sensor package 300 in generally. Exemplary materials include, but are not limited to silicone, silicone-based composites, and any combinations, derivations, and compositions thereof. Such materials typically have a first state with a viscosity that permits the material to be dispensed into the cavity 356, and a second state with a viscosity that is greater than that of the first state. This second state is often the result of some type of processing such as curing, drying, cooling, and the like. It may be desirable, for example, that the encapsulating gel 358 is sufficiently flexible to allow one or more of the first device 322, and the third device 334 to be responsive to changes in the environmental properties, e.g., changes in the ambient pressure.

Figure 7:
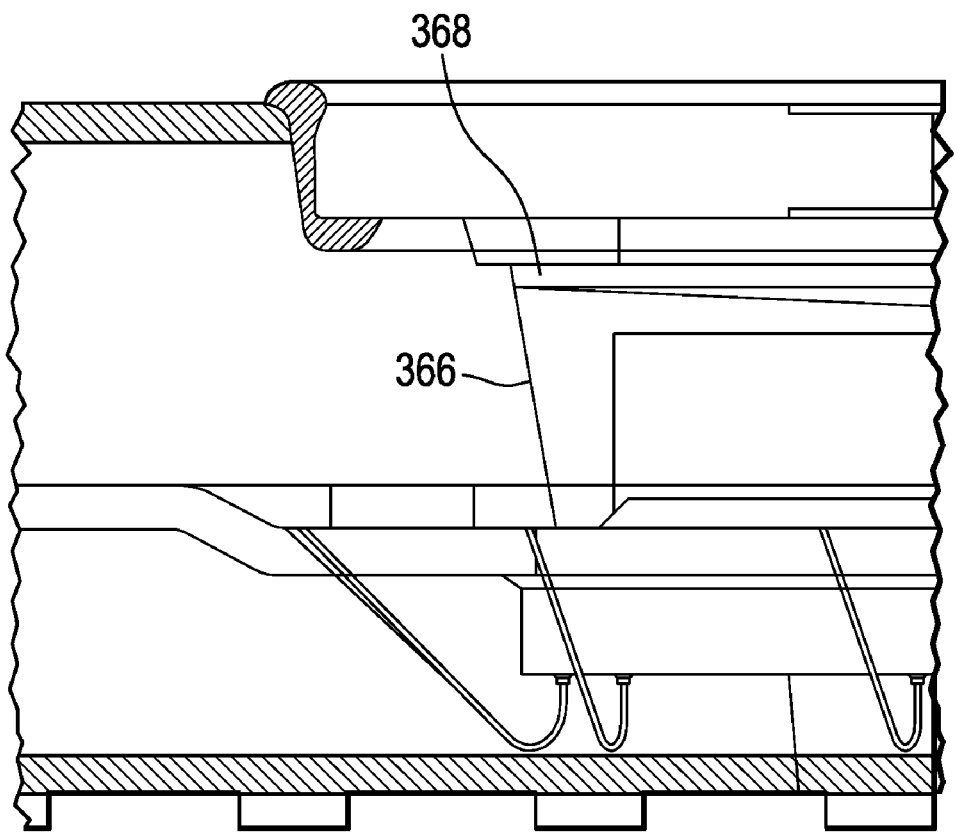
FIG. 7 is a detailed, plan view of the cross-section of the sensor package of FIG. 6.

Continuing generally with the discussion of the embodiment of sensor package 300 that is illustrated in FIGS. 5-7, and more particularly in terms of the fabrication of sensor packages having features like sensor packages 100, 200, 300 ("the sensor packages"), construction of the sensor packages can be accomplished as follows below. By way of non-limiting example, an ASIC chip may be secured to the respective lower surface of the placement area of the leadframe so as to position its connective pads near one side for connection with leads that are similarly positioned proximate the same side of the leadframe. Wirebonds are attached from the ASIC connective pads to corresponding leads, and particularly to the ends of the leads in the area of interconnectivity.

The housing may then be formed by over-molding the ASIC chip and the leadframe, sealing the ASIC chip from the environment. This also forms a cavity, into which the sensor is mounted, and in the examples of the devices described herein, the pressure sensor ("the BAPS") and the accelerometer are secured to the upper surface of the placement area of the leadframe. It is also preferable that the connective pads of the BAPS and the accelerometer are positioned in the internal connective region proximate the same side of the leadframe as the connector pads of the ASIC chip. The connective pads of the BAPS and the accelerometer are wire bonded with wirebonds to the ends of the lead, establishing an electrical connection.

The encapsulating gel is deposited in the cavity over the BAPS and the accelerometer. This can be cured, such as by subjecting the gel to a UV light. The cover is secured to the opening of the cavity, using a sealant such as epoxy sealant, or other suitable material with adhesive properties compatible with the devices discussed and contemplated herein.

The fabrication of the sensor packages may further comprise steps where the sensor packages are singulated from other sensor packages. For example, in an untrimmed form, the leadframes of adjacent sensor packages may be connected with one or more tie bars that are broken, severed, or otherwise separated to form individual ones of the sensor packages. Singualtion is done using known methods, and thus are not described in detail herein.

The pins, which extend externally from the housing, can be in one embodiment formed from the leadouts of the sensor package. For example, the leadouts can be deformed so as to shape the pins in such a way as to permit the pins to connect to external circuitry. Such circuitry may be, for instance, located on a printed circuit board, and/or a semiconductor device.

In view of the foregoing, the fabrication technique discussed above, as well as other processes for manufacturing the sensor packages contemplated herein can employ conventional molding techniques where a plurality of leadframes are provided. While these techniques and processes are generally recognized by artisans skilled in the art, it is well within the scope and spirit of the present disclosure that other steps, processes, and techniques may be developed, and employed to manufacture the sensor packages so as to include concepts of such embodiments disclosed herein. For example, other embodiments of the sensor packages may comprise devices in addition to, or different from, the devices described herein. This may require other, new, and/or different materials of construction (and methods of construction) that are necessary to form parts and portions of the sensor package. In one example, the processes, materials, and methods may be compatible with placement of the sensor device and the ASIC device so as to position the connective pads of these devices within the internal connective region, and thereby position them for connection to the area of interconnectivity.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A sensor package comprising:
   a metal leadframe comprising a first side, a second side, an upper surface, and a lower surface in opposing relation to the upper surface, wherein the metal leadframe has at least a first tie bar extending from the first side of the metal leadframe and at least a second tie bar extending from the second side of the metal leadframe;
   a first device disposed on the upper surface of the metal leadframe, the first device comprising a first connective pad proximate the first side of the metal leadframe;
   a second device disposed on the lower surface of the metal leadframe, the second device comprising a second connective pad proximate the first side of the metal leadframe;
   a housing in surrounding relation to the second device, the housing comprising a cavity exposing the first device to an environment external to the housing; and
   a first lead coupled to the first connective pad and the second connective pad, the first lead comprising an end proximate the first side,
   wherein the first lead receives a wirebond from each of the first connective pad and the second connective pad in a manner that forms a connection between the first device and the second device entirely inside of the housing.

2. A sensor package according to claim 1, further comprising a leadout coupled to the second device, wherein the leadout extends outside of the housing in a manner that permits electrical connection between the second device and circuitry external to the housing.

3. A sensor package according to claim 1, wherein the first device is configured to capture data from the environment.

4. A sensor package according to claim 3, further comprising:
a third device disposed on the upper surface, the third device comprising a third connective pad proximate the first side of the metal leadframe; and
a third lead coupled to the third connective pad, the third lead comprising an end proximate the first side, wherein the third lead receives a wirebond from the third connective pad and the second device in a manner that forms a connection between the third device and the second device entirely inside of the housing.

5. A sensor package according to claim 4, wherein the third lead is coupled to the second device.

6. A tensor package according to claim 1, further comprising:
an encapsulating gel disposed in the cavity, the encapsulating gel comprising a material permitting communication between the first device and the environment; and
a cover positioned over the encapsulating gel, the cover comprising an aperture exposing the cavity to the environment.

7. A sensor package for mounting to the surface of a printed circuit board, said sensor package comprising:
a metal leadframe comprising an outer edge in surrounding relation to a placement area having a first side, a second side, and a pair of opposing surfaces, the opposing surfaces comprising an upper surface and a lower surface in planar relation to the upper surface, wherein the metal leadframe has at least a first tie bar extending from the first side of the metal leadframe and at least a second tie bar extending from the second side of the metal leadframe;
a sensor disposed on the upper surface of the metal leadframe, the sensor comprising a plurality of sensor devices, each of the sensor devices comprising a connective pad proximate the first side of the placement area
a processing device disposed on the lower surface of the metal leadframe, the processing device comprising a connective pad proximate the first side of the placement area, the processing device for processing data from the sensor devices;
a housing surrounding the metal leadframe, the housing comprising a portion sealing the processing device from an environment external to the housing, and a cavity exposing at least one of the sensor devices to the environment; and
a plurality of leads, one lead coupled to each of the connective pads of the sensor devices, each of the leads comprising an end proximate the first side, wherein the leads receive a wirebond from the connective pads so as to form a connection between the sensor devices and the processing device that is entirely within the housing.

8. A sensor package, for mounting to the surface of a printed circuit board, said sensor package comprising:
a leadframe comprising an outer edge in surrounding relation to a placement area having a first side, a second side, and a pair of opposing surfaces, the opposing surfaces comprising an upper surface and a lower surface in planar relation to the upper surface;
a sensor disposed on the upper surface, the sensor comprising a plurality of sensor devices each of the sensor devices comprising a connective pad proximate the first side of the placement area;
a processing device disposed on the lower surface, the processing device comprising a connective pad proximate the first side of the placement area, the processing device for processing data from the sensor devices;
a housing surrounding the leadframe, the housing comprising a portion sealing the processing device from an environment external to the housing, and a cavity exposing at least one of the sensor devices to the environment;
a plurality of leads, one lead coupled to each of the connective pads of the sensor devices, each of the leads comprising an end proximate the first side, wherein the leads receive a wirebond from the connective pads so as to form a connection between the sensor devices and the processing device that is entirely within the housing; and
an encapsulating gel disposed in the cavity, the encapsulating gel comprising a material having a first state, and a second state with a viscosity that is greater than the viscosity of the first state.

9. A sensor package according to claim 8, wherein the cavity comprises a lower portion proximate the upper surface, a wall that extends away from the lower portion, and a shelf disposed on the wall opposite the lower portion, the shelf comprises at least one surface extending into the cavity.

10. A sensor package according to claim 9, further comprising a cover positioned over the encapsulating gel, the cover comprising an aperture exposing the cavity to the environment.

11. A sensor package according to claim 7, wherein one of the sensor devices is configured to capture data from the environment.

12. A sensor package according to claim 11, wherein the sensor devices comprise a first device for sensing pressure, and a second device for measuring acceleration.

13. A sensor package according to claim 12, wherein the first device comprises a Backside Absolute Pressure ("BAPS") sensor device.

14. A sensor package according to claim 7, further comprising a leadout coupled to the processing device, the leadout comprising an end proximate the second side, the end for receiving a wirebond from the processing device, wherein the leadout extends out of the housing in a mariner that permits electrical connection of the processing device with circuitry external to the housing.

15. A method for manufacturing a sensor package, the method comprising:
forming a metal leadframe comprising an outer edge in surrounding relation to a placement area having a first side, a second side, an upper surface and a lower surface in planar relation to the upper surface;
mounting a first sensor device to the upper surface in a manner positioning a first connective pad proximate the first side of the placement area mounting a processing device to the lower surface in a manner positioning a second connective pad proximate the first side of the placement area, wherein the metal leadframe has at least a first tie bar extending from the first side of the metal leadframe and at least a second tie bar extending from the second side of the metal leadframe;
forming a housing by over molding the processing device in a manner isolating the processing device from an environment outside of the housing; and
wirebonding the first connective pad and the second connective pad to a first lead, the first lead comprising an end proximate the first side, wherein the first lead receives a wirebond from each of the first connective pad and the second connective pad so as to form a connection between the first sensor device and the processing device that is entirely within the housing.

16. A method according to claim 15, further comprising:
forming a cavity in the housing around the first sensor device to the environment; and
sealing the cavity in a manner exposing the first sensor device to the environment.

17. A method for manufacturing a sensor package, the method comprising:
forming a metal leadframe comprising an outer edge in surrounding relation to a placement area having a first side, a second side, an upper surface and a lower surface in planar relation to the upper surface;
mounting a first sensor device to the upper surface in a manner positioning a first connective pad proximate the first side of the placement area, mounting a processing device to the lower surface in a manner positioning a second connective pad proximate the first side of the placement area, wherein the metal leadframe has at least a first tie bar extending from the first side of the metal leadframe and at least a second tie bar extending from the second side of the metal leadframe;
forming a housing by over molding the processing device in a manner isolating the processing device from an environment outside of the housing; and
wirebonding the first connective pad and the second connective pad to a first lead, the first lead comprising an end proximate the first side, wherein the first lead receives a wirebond from each of the first connective pad and the second connective pad so as to form a connection between the first sensor device and the processing device that is entirely within the housing;
forming a cavity in the housing around the first sensor device to the environment; and
sealing the cavity in a manner exposing the first sensor device to the environment,
depositing an encapsulating gel into the cavity, the encapsulating gel comprising a material having a first state and a second state with a viscosity that is greater than the viscosity of the first state.

18. A method according to claim 17, further comprising mounting a second sensor device to the upper surface in a manner positioning a third connective pad proximate the first side of the placement area and wirebonding the third connective pad and the processing device to a second lead, the second lead comprising an end proximate the first side of the placement area, wherein the second lead receives a wirebond from the third connective pad and the processing device so as to form a connection between the first sensor device and the processing device that is entirely within the housing.

19. A sensor package according to claim 18, wherein the first sensor device is configured to capture data from the environment.

20. A method according to claim 18, further comprising wirebonding the processing device to a leadout, wherein the leadout extends outside of the housing in a manner that permits electrical connection of the processing device to circuitry external to the housing.

* * * * *